United States Patent
Li et al.

(10) Patent No.: US 6,326,663 B1
(45) Date of Patent: Dec. 4, 2001

(54) AVALANCHE INJECTION EEPROM MEMORY CELL WITH P-TYPE CONTROL GATE

(75) Inventors: Xiao-Yu Li, San Jose; Steven J. Fong, Santa Clara; Sunil D. Mehta, San Jose, all of CA (US)

(73) Assignee: Vantis Corporation, Sunnyvale, CA (US)

(*) Notice: Subject to any disclaimer, the term of this patent is extended or adjusted under 35 U.S.C. 154(b) by 0 days.

(21) Appl. No.: 09/277,441

(22) Filed: Mar. 26, 1999

(51) Int. Cl.$^7$ ................................................ H01L 29/788
(52) U.S. Cl. ................... 257/318; 257/319; 257/321; 257/322
(58) Field of Search ..................... 257/318, 319, 257/322, 321; 438/263, 264; 365/185.1, 185.14, 185.26, 185.28

(56) References Cited

U.S. PATENT DOCUMENTS

| | | | |
|---|---|---|---|
| 4,037,242 | 7/1977 | Gosney | 365/185.08 |
| 4,885,719 | 12/1989 | Brahmbhatt | 365/185.17 |
| 5,103,425 | 4/1992 | Kuo et al. | 365/185.23 |
| 5,366,915 | 11/1994 | Kodama | 438/257 |
| 5,554,552 | 9/1996 | Chi | 438/264 |
| 5,587,945 | 12/1996 | Lin et al. | 365/185.1 |
| 5,615,150 | 3/1997 | Lin et al. | 365/185.17 |
| 5,640,346 | 6/1997 | Preslar | 365/185.1 |
| 5,646,901 | 7/1997 | Sharpe-Geisler et al. | 365/218 |
| 5,719,427 | 2/1998 | Tong et al. | 257/355 |
| 5,761,116 | 6/1998 | Li et al. | 365/185.1 |
| 5,783,457 | 7/1998 | Hsu | 438/302 |
| 5,912,488 | 6/1999 | Kim et al. | 257/316 |
| 5,929,479 * | 7/1999 | Oyama | 257/315 |
| 5,969,992 | 10/1999 | Mehta et al. | 365/185.28 |
| 6,157,568 * | 12/2000 | Schmidt | 365/185.1 |

FOREIGN PATENT DOCUMENTS

| | | |
|---|---|---|
| 0 295 935 A1 | 12/1988 | (EP). |
| 0 354 457 | 2/1990 | (EP). |
| 0 714 133 | 5/1996 | (EP). |
| 0 776 049 | 5/1997 | (EP). |
| 0 865 045 | 9/1998 | (EP). |
| 2 022 922 | 12/1979 | (GB). |
| 60 053083 | 3/1985 | (JP). |
| 06 204492 | 7/1994 | (JP). |
| 10 074850 | 3/1998 | (JP). |
| 10 223782 | 8/1998 | (JP). |
| WO 93 18519 | 9/1993 | (WO). |
| WO 97 02605 | 1/1997 | (WO). |

\* cited by examiner

*Primary Examiner*—Eddie Lee
*Assistant Examiner*—George C. Eckert, II
(74) *Attorney, Agent, or Firm*—Fliesler Dubb Meyer & Lovejoy LLP

(57) ABSTRACT

A non-volatile memory cell, comprising a semiconductor substrate having a first conductivity type. A control region is formed of said first conductivity type in the substrate and a control region oxide formed over the control region. The cell includes a program element having a first active region of a second conductivity type formed in said substrate, a doped or implanted region adjacent to said first active region, and a gate oxide overlying at least the channel region. An active region oxide covers a portion of the first active region. A floating gate is formed over said semiconductor substrate on said active region oxide and said control region oxide.

23 Claims, 3 Drawing Sheets

AVALANCHE INJECTION EEPROM MEMORY CELL WITH P-TYPE CONTROL GATE

BACKGROUND OF THE INVENTION

1. Field of the Invention

The invention relates to nonvolatile memory, and particularly an EEPROM device suitable for use in programmable logic devices and a method of forming the device.

2. Description of the Related Art

Non-volatile memory devices of the type commonly referred to in the art as EPROM, EEPROM, or Flash EEPROM serve a variety of purposes, and are hence provided in a variety of architectures and circuit structures.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), reliability is more important and space is at less of a premium. Generally, arrays of individual memory cells are formed on a single substrate and combined with sense and read circuitry, and connected by row-wise and column-wise conductive regions or metallic conductors to allow for array wide bulk program and erase as well as selected bit programming.

Semiconductor process technology has continued to move toward defining smaller device features, and the conventional "stacked gate" EEPROM structure has given way to different cell designs and array architectures, all intended to increase density and reliability in the resulting circuit. In addition, in EEPROM devices used for programmable logic devices, designers strive to reduce power requirements of devices by reducing program and erase voltage requirements.

Conventionally, programmable logic EEPROMS were typically formed by stacked gate devices operating utilizing Fowler-Nordheim tunneling to program and erase the floating gate or in single polysilicon-based cells such as that set forth in U.S. Pat. No. 4,924,278. An alternative to the aforementioned Fowler-Nordheim tunneling-based cell structures is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then injected into the floating gate to program the cell. To program the flash ZEEPROM cell, the PN junction is reverse-biased to create an electric field of approximately $10^6$ volt/cm. and generate energetic hot electrons independent of the channel length. The P+ region adjacent to the drain enhances this generation. A low junction breakdown voltage can be used for programming by optimizing the PN junction depth and profiles.

A structure and method for programming an avalanche injection cell is detailed in co-pending U.S. patent application Ser. No. 08/871,589, inventors Hao Fang, et al., filed Jul. 24, 1998 and assigned to the assignee of the present application.

In Fang, et al. the non-volatile memory cell is formed of a P substrate having embedded therein an N+ source region, an N-type diffused drain region, a floating gate capacitively coupled to the P substrate through a tunnel oxide, or other gate dielectric such as nitride oxide; and a control gate coupled capacitively to the floating gate through an oxide/nitride/oxide, or other type of inter polysilicon dielectric, film. The diffused region is formed of a shallowly diffused but heavily doped N-type junction, while the source region is formed of a deeply diffused but lightly doped N junction.

To program the cell, electron injection is effected from the drain side. The programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift down with the voltage threshold $V_t$ by 4 volts.

The Fang, et al. application also teaches a single polysilicon layer embodiment wherein the stacked control gate is replaced with a diffusion region. FIG. 1 represents a schematic depiction of such embodiment. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. Cell size is decreased in comparison to conventional single poly memory cells for programmable logic devices.

Even with the scaling advantages presented by the ZEEPROM-type cells, designers constantly seek to improve scalability, performance and cost advantages of cells.

Each of the aforementioned configurations presents advantages and disadvantages when used in particular applications. Nevertheless, improvements in both the structure of individual cells and the manner in which they are connected together will result in more reliable, stable, faster, and lower power devices which can be programmed and erased at lower voltages.

SUMMARY OF THE INVENTION

In one aspect, the invention, roughly described, comprises a non-volatile memory cell. The cell is formed on and in a semiconductor substrate having a first conductivity type and includes a control region formed of said first conductivity type in a well of a second conductivity type in the substrate. A control region oxide is formed over the control region. The cell includes a program element having a first active region of a second conductivity type formed in said substrate. A doped or implanted impurity region of the first conductivity type is positioned adjacent to said first active region, and an active region oxide overlies at least a portion of the first active region. A floating gate is formed over said semiconductor substrate on said active region oxide and said control gate oxide.

In one aspect, the channel region and the control region are formed simultaneously by, for example, an impurity implant of said first conductivity type into said control region and channel region. Using the cell of the present invention provides advantages in scaling and improves the quality of the oxide formed over the control region.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

A novel EEPROM structure, including a buried control gate formed of a p-type impurity, is hereafter disclosed. In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

Figure 1:
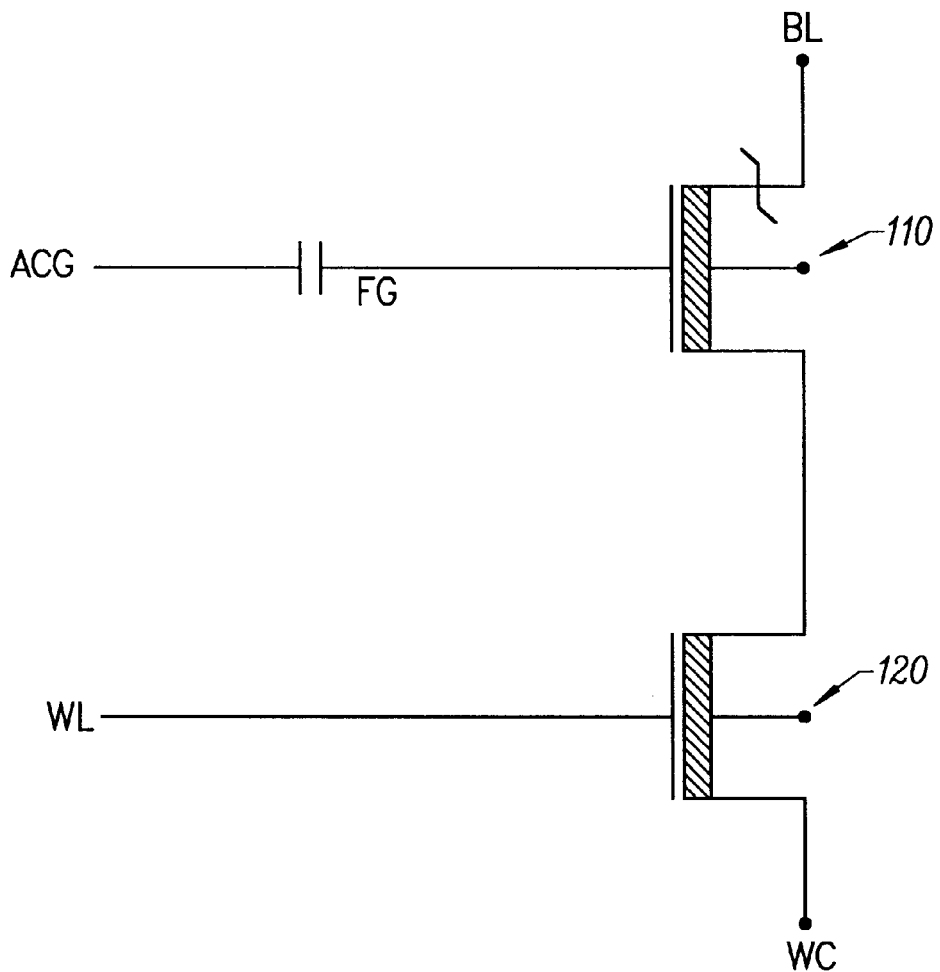
FIG. 1 is a schematic diagram of the single polysilicon embodiment of the avalanche/Zener injection EEPROM cell of the prior art.
Figure 2:
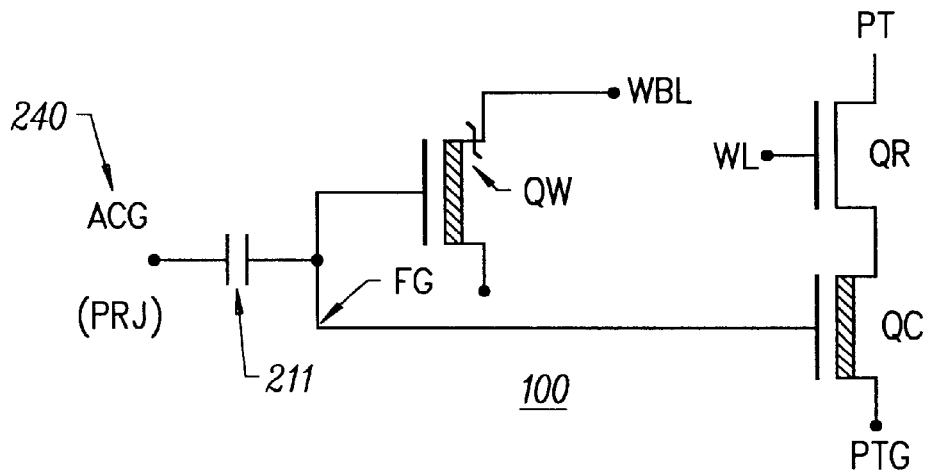
FIG. 2 is a schematic diagram of a first embodiment of an avalanche/Zener injection EEPROM cell of the present invention.

FIG. 2 shows a schematic diagram of a first embodiment of a nonvolatile memory cell structure formed in accordance with one aspect of the present invention.

Structure 100 includes an (array) control gate ACG, floating gate FG, avalanche/Zener program element $Q_w$, a read transistor $Q_r$, and a sense element $Q_c$. The array control gate (ACG) 240 is used to accelerate electrons or holes selectively to or from the floating gate FG by capacitively coupling a field across the oxide that separates the avalanche element from the floating gate.

Figure 4:
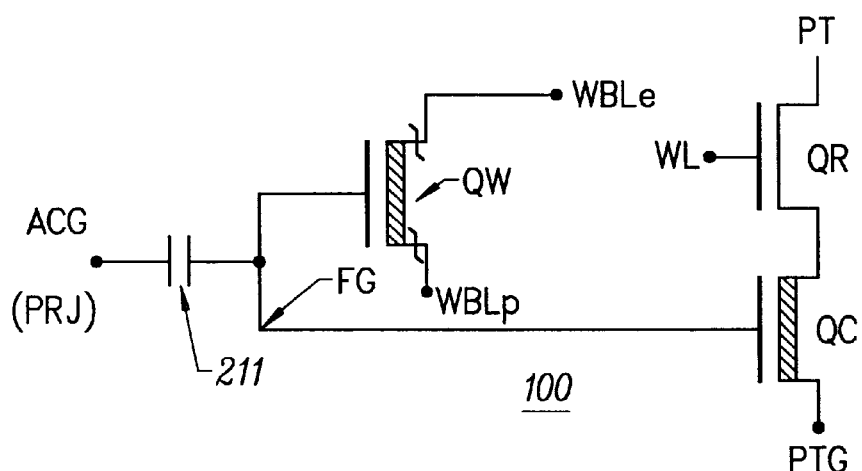
FIG. 4 is a schematic diagram of a second embodiment of an avalanche/Zener injection EEPROM cell of the present invention.
Figure 3:
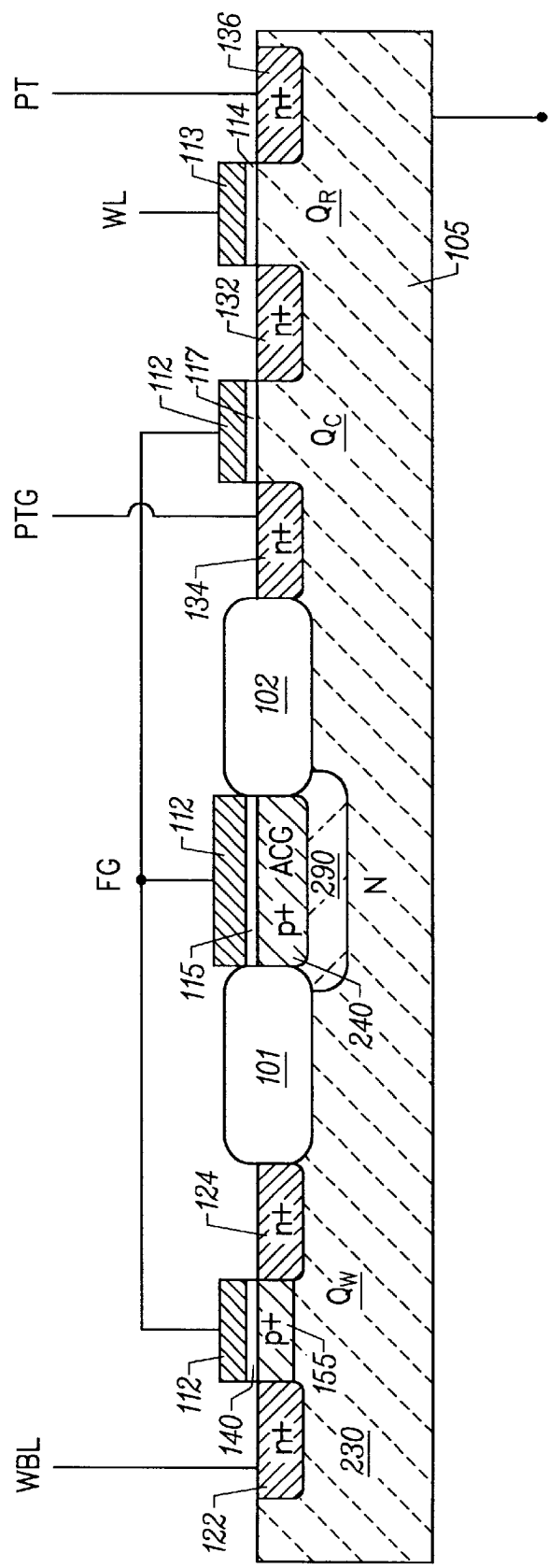
FIG. 3 is a semiconductor cross-section of the avalanche/Zener injection EEPROM cell of the present invention.

As shown in FIG. 2, sense transistor $Q_c$ and avalanche element $Q_w$ share floating gate FG 112. Floating gate FG 112 is capacitively coupled to array control gate (ACG) 240 voltage via capacitor 211. As shown in FIG. 3, capacitor 211 comprises ACG region 240 and program gate oxide 115. In the first embodiment shown in FIG. 2, program and erase by hot carrier generation occurs at one junction of the program element $Q_w$, that is, at the p-n junction between region 122 and channel 230. Program and erase can be separated over separate junctions (i.e. program over the junction between region 122 and channel 230 and erase at the junction between region 124 and channel 230) as shown in FIG. 4.

Program element $Q_w$ allows program and erase of EEPROM 100 through generation of hot electrons and hot holes which are swept onto the floating gate upon application of appropriate voltage to the program junction, as described below.

FIG. 3 shows an exemplary cross-section of the embodiment of the EEPROM cell 100 as formed on a semiconductor substrate 105. It should be understood that numerous ones of such cells are formed in a single integrated circuit device in an array in accordance with well-known techniques. Silicon substrate 105 has a first conductivity type such as a P-type conductivity having a background doping concentration of about $1\times10^{15}$–$1\times10^{17}$ cm$^{-3}$.

Avalanche/Zener program element $Q_w$ shares floating gate FG with sense element $Q_c$, and includes a first active region 122 and second active region 124. Floating gate FG 112 overlies the program element oxide layer 140, the program junction oxide 115 and sense oxide layer 117. Floating gate FG is formed of a conducting material, such as a polycrystalline silicon material.

In accordance with the invention, array control gate 240 is formed of a conductivity type the same as the substrate, in this embodiment a p-type impurity, and is provided on one side of the field oxide region 101. A well region 290 is provided in the substrate 105 prior to formation of the control gate 240. The n well 290 serves to isolate the control gate region 240 and allow specific selection of the control gate 240 during device operation.

Program element $Q_w$ is electrically separated from the ACG 240 by isolation region 101, and the ACG is separated from sense transistor $Q_c$ by isolation region 102, e.g. silicon dioxide, also formed in the semiconductor substrate 105. Field oxidation regions 101 and 102 represent a device isolation structure formed in accordance with well known techniques such as LOCOS, trench isolation, shallow trench isolation and various equivalent alternatives. The shape of the isolation depicted in the figures of the present disclosure is not intended to limit the nature of the type of isolation used herein.

A channel 230 is positioned between regions 122 and 124. Overlying the channel 230 is an oxide layer 140. The oxide layer 140 is typically composed of an insulating material, such as silicon dioxide, and has a thickness of approximately 80 to 150 angstroms. Oxide layer 140 may be deposited or grown (using conventional oxide deposition techniques) in a single process step.

Prior to formation of the gate stacks (regions 112/140, 112/117 and 113/114), a p+ type impurity implant is made in the substrate to form a p+ region 155 in the channel 230 of the program element $Q_w$ adjacent to regions 122 and 124. Typically an implant of boron at an energy of 30 to 200 KeV, to a depth as great as 0.1 to 0.4 μm in a concentration of about $1\times10^{18}$ to $1\times10^{20}$ cm$^{-3}$ is suitable. This p-type impurity implant allows for specific breakdown voltage engineering of the avalanche program element $Q_w$ of the cell with a great deal of accuracy. In cell 100, reverse breakdown voltages in a range of 3V to 10V may be used in order to generate energetic hot carriers independent of the channel length of the device. It should be recognized with reference to Ranaweera, et al., that the breakdown characteristics of the various P+ N+ junctions varies with the concentration of the P+ region 155.

In an advantageous feature of the invention, the implant utilized to form impurity region 155 can likewise be utilized to form the control gate region 240 and save processing steps. It will be recognized that such implant is advantageous in either the single side embodiment of FIG. 2 or the two-side (program/erase) embodiment of FIG. 4.

Gate oxide 115 and floating gate 112 are formed in accordance with conventional techniques by, for example, forming a thermal oxide on the surface of substrate 105, depositing a polysilicon layer on top of the gate oxide, and etching the gate oxide and polysilicon layers to form oxides 114, 115, 117 and 140 and floating gate 112. Various alternative methods are suitable for growing the gate oxide layer and are well within the knowledge of one of average skill in the art. For example, oxide 115 may be grown during the same step or separate steps. Likewise, numerous techniques for forming the floating gate layer may be used, including, but not limited to depositing polysilicon by chemical vapor deposition or sputtering and annealing techniques well known to one of average skill in the art. Etching of the polysilicon and gate oxide layers may be performed by any number of suitable wet or dry directional etch step in accordance with well-known techniques.

Sense transistor $Q_c$ shares first active region 132 with read transistor $Q_r$. Gate 113 of read transistor $Q_r$ is connected to word line WL. Active region 136 of read transistor $Q_r$ is connected to a read signal select (product term) PT, while region 134 of sense transistor Qc is connected to sense signal (product term ground) PTG.

A sense transistor channel is formed between region 134 and region 132. The conductivity of the region 134 and region 132 is of the second conductivity type, for example, an N+ conductivity type. Overlying the sense channel is an oxide layer 117 having an approximate thickness of 80 angstroms. The sense gate oxide layer 117 may also be simultaneously formed with the oxide layer 140. Depending on the mode of sense transistor $Q_c$ (depletion or enhancement mode), the relevant voltages for operating the EEPROM cell 100 are adjusted. The sense transistor $Q_c$ is, in one embodiment, a depletion mode transistor, as is commonly understood in the industry. In a further embodiment, the sense transistor $Q_c$ is an enhancement mode transistor (also as commonly known in the industry).

The read transistor $Q_r$ includes region 132 and region 136, both formed of the second conductivity type, e.g. an N+ conductivity type. A channel is positioned between regions 132 and 136. Overlying the read channel is an oxide layer 114 that is composed of an insulating material, such as silicon dioxide, and has an approximate thickness of 25–150 angstroms. Oxide layer 114 may be formed in the same step as the oxide layer 117, or in a separate step. A read gate 113 overlies the read oxide layer 114 and is composed of a conducting material, such as a polycrystalline silicon material.

Regions 122, 124, 132, 134 and 136 may be formed by an impurity implant of a dopant having a conductivity type opposite to that of the substrate (arsenic or phosphorus, for example) to form self-aligned active regions in substrate 105. Typical junction depths of 0.1 $\mu$m to 0.5 $\mu$m and doping concentration of about $5\times10^{18}$ to $1\times10^{21}$ cm$^{-3}$ are suitable for regions 134,132 and 136. Substrate 105 may optionally have a connection 107 to allow for biasing the substrate.

Exemplary operational characteristics for the device shown in FIGS. 2 and 3 are given as follows: to add electrons to floating gate FG 112, the substrate is biased to 0V, region 124 is internally isolated, region 122 is at, for example, 8V and the FG is coupled to a positive voltage from control gate ACG, such as 8V. To remove electrons from FG, the substrate is biased to 0V, region 124 is floating or isolated, second region 122 is at 8V and FG is at a low voltage coupled to the ACG of about 0V. It should be understood that either adding electrons (or removing holes), or removing electrons (or adding holes) can constitute a "program" or "erase" operation, as such "program" or "erase" operation is defined by the context of the overall device in which the non-volatile memory cell is used. It should be noted that the voltage on the product-term ground connection may be varied in accordance with the EEPROM design constraint that a higher voltage will increase program/erase speed, but may induce greater oxide damage, while lower voltages will ensure better oxide qualities, and hence greater data retention integrity, over time.

Typical operating voltages for the foregoing lines in the cell shown in FIG. 2 are given in Table 1:

TABLE 1

|  | WBL | SUBSTRATE | ACG | PT | PTG | WL |
|---|---|---|---|---|---|---|
| Erase | 6 v | 0 v | 8 v | Float | >0–8 v | Vcc |
| Program | 6 v | 0 v | 0 v | Float | 0 v | 0 v |

In contrast with the cell disclosed in U.S. Pat. No. 4,924,278, the cell of the present invention utilizes the avalanche/Zener injection capacities of the aforementioned prior art to place electrons or holes on the floating gate in accordance with the techniques described therein.

Because of the separate formations for each of the elements, the diode doping gradient for transistor $Q_w$ can be selected to control the avalanche breakdown voltage of cell $Q_w$, and a scaling of the programming voltage below current known levels.

In a further unique aspect of the present invention, a reduction in program voltage coincident with the avalanche/Zener program element allows a reduction in oxide thickness for all floating gate elements. It should be recognized that the amount of oxide thickness reduction is limited by the necessity to maintain data retention integrity. Separation of the read path and program elements in the present embodiment further allows one to use differing oxides for the read and sense elements.

It should be recognized that the cell described herein may be utilized with any number of coupling arrangements in any number of matrix arrangements shown herein or in the prior art. It should be further recognized that the method of the present invention may be utilized to construct a non-volatile device wherein the operating parameters vary from the exemplary embodiment set forth above.

In the alternative embodiment of the present invention shown in FIG. 4, programming and erase using hot electrons or hot holes generated by Zener/avalanche breakdown performed over different regions of the cell oxide 140, alternatively any regions 124/155 and 122/155 improves the quality of oxide 140 over prolonged program and erase.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A non-volatile memory cell, comprising:

a semiconductor substrate having a first conductivity type;

a first well region of a second conductivity type in the substrate;

a control region formed of said first conductivity type formed in the first well region in the substrate;

a control region oxide formed over the control region;

a program element having a first active region and a second active region of a second conductivity type formed in said substrate, an implant region having said first conductivity type formed between said first and second active regions, and a gate oxide overlying the implant region; and a floating gate formed over said gate oxide and said control region oxide.

2. The non-volatile memory cell of claim 1, wherein said first conductivity type is p-type.

3. The non-volatile memory cell of claim 1, wherein said control region is doped with at least $10^{18}$ cm$^{-3}$ of boron.

4. The non-volatile memory cell of claim 1 wherein said implant region and said control region are formed in a single implant step.

5. The non-volatile memory cell of claim 1 wherein a plurality of hot carriers are injected into said floating gate to program and erase said memory cell.

6. The non-volatile memory cell of claim 1 further including a sense transistor formed on and in said substrate, and capacitively coupled to a portion of the floating gate.

7. The non-volatile memory cell of claim 1 further including a read transistor coupled to the sense transistor.

8. A non-volatile memory cell, comprising:
   a semiconductor substrate having a p-type background doping concentration;
   a p-type control region formed in a well in the substrate;
   a control region oxide overlying the control region;
   a program element including a first active region having an n-type conductivity formed in said substrate, a second active region, and a doped region formed of a p-type conductivity formed between said first and second active regions; and
   a floating gate formed over said control region oxide;
   wherein a plurality of hot carriers are injected into said floating gate to program and erase said memory cell.

9. The non-volatile memory cell of claim 8, wherein said plurality of hot carriers used to program said memory cell are generated by Zener/Avalanche breakdown at a PN junction formed by said first active region and said doped region.

10. The Zener/avalanche MOS gate non-volatile memory cell structure of claim 9, wherein said first active region is a P+ diffusion containing at least $10^{18}$ cm$^{-3}$ of boron.

11. The non-volatile memory cell of claim 8, wherein said plurality of hot carriers used to erase said memory cell are generated by Zener/Avalanche breakdown at a PN junction formed by said second active region and said doped region.

12. The non-volatile memory cell of claim 8 further including a sense transistor formed on and in said substrate, and capacitively coupled to a portion of the floating gate.

13. The non-volatile memory cell of claim 8 further including a read transistor coupled to the sense transistor.

14. The non-volatile memory cell of claim 8, wherein said control region is doped with at least $10^{18}$ cm$^{-3}$ of boron.

15. The non-volatile memory cell of claim 8 wherein said control region and said doped channel region are formed by a common implant step.

16. The non-volatile memory cell of claim 8, wherein said plurality of hot carriers used to erase said memory cell are generated by Zener/Avalanche breakdown at a PN junction formed by said first active region and said doped region.

17. A non-volatile memory cell structure, comprising:
   a semiconductor substrate of a first conductivity type having a surface;
   a well region of a second conductivity type formed below said surface of said substrate;
   a first active region of the first conductivity type formed in the well;
   a program element including a second active region and a third active region of said second conductivity type, and a doped channel region of said first conductivity type positioned between said second and third active regions; and
   a floating gate formed over and insulated from said channel region and said first active region, said floating gate capacitively coupled to said program element and first active region through at least one oxide layer.

18. The memory cell structure of claim 17 wherein hot holes are injected into said floating gate at said second active region to program said memory cell and hot electrons are injected into said floating gate at said third active region to erase said memory cell.

19. The nonvolatile memory cell of claim 17 wherein the first conductivity type is p-type.

20. The non-volatile memory cell of claim 17 wherein said first active region and said channel region are formed from a single implant step.

21. A non-volatile memory cell, comprising:
   a semiconductor substrate having a first conductivity type;
   a well region of a second conductivity type formed in said semiconductor substrate;
   a control region of the first conductivity type formed in said well region; and
   a program element formed in said semiconductor substrate, said program element having a channel region of the first conductivity type.

22. The non-volatile memory cell of claim 21, wherein said program element includes first and second active regions of the second conductivity type, the channel region being between the first and second active regions.

23. The non-volatile memory cell of claim 21 further including a floating gate coupled to said control region and the channel region.

* * * * *